United States Patent

Honda et al.

[11] Patent Number: 5,648,324
[45] Date of Patent: Jul. 15, 1997

[54] PHOTORESIST STRIPPING COMPOSITION

[75] Inventors: Kenji Honda, Barrington; Donald F. Perry, North Providence; Taishih Maw, Cumberland, all of R.I.

[73] Assignee: OCG Microelectronic Materials, Inc., Norwalk, Conn.

[21] Appl. No.: 590,005

[22] Filed: Jan. 23, 1996

[51] Int. Cl.$^6$ .................................................. C11D 7/32
[52] U.S. Cl. ...................... 510/176; 510/255; 510/500; 252/394; 134/38
[58] Field of Search ............................ 510/176, 255, 510/500, 245; 252/394; 134/38

[56] References Cited

U.S. PATENT DOCUMENTS

| | | | |
|---|---|---|---|
| 4,177,155 | 12/1979 | Popplewell | 508/281 |
| 4,268,610 | 5/1981 | Roos | 430/281 |
| 4,617,251 | 10/1986 | Sizensky et al. . | |
| 4,683,071 | 7/1987 | Regenass et al. | 508/281 |
| 4,770,713 | 9/1988 | Ward . | |
| 4,824,763 | 4/1989 | Lee . | |
| 4,904,571 | 2/1990 | Miyashita et al. . | |
| 5,006,279 | 4/1991 | Grobbel et al. | 510/500 |
| 5,102,777 | 4/1992 | Lin et al. . | |
| 5,110,494 | 5/1992 | Beck | 270/255 |
| 5,279,791 | 1/1994 | Lee . | |
| 5,308,745 | 5/1994 | Schwartzkopf . | |
| 5,334,332 | 8/1994 | Lee . | |
| 5,399,464 | 3/1995 | Lee . | |
| 5,417,802 | 5/1995 | Oberg . | |
| 5,417,877 | 5/1995 | Ward | 510/176 |
| 5,472,830 | 12/1995 | Honda . | |
| 5,507,978 | 4/1996 | Honda | 510/176 |
| 5,545,353 | 8/1996 | Honda et al. | 510/176 |
| 5,580,482 | 12/1996 | Chasan | 508/243 |

FOREIGN PATENT DOCUMENTS

| | | |
|---|---|---|
| 647884 | 4/1995 | European Pat. Off. . |
| 3828513 | 3/1990 | Germany . |
| 56-115368 | 9/1981 | Japan . |
| 63-208043 | 8/1988 | Japan . |
| 64-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |
| 7-028254 | 1/1995 | Japan . |
| 7-271056 | 1/1995 | Japan . |

*Primary Examiner*—Prince Willis, Jr.
*Assistant Examiner*—Cephia D. Toomer
*Attorney, Agent, or Firm*—William A. Simons; Wiggin & Dana

[57] ABSTRACT

A photoresist stripping composition containing:
(a) 20–70% by weight of an organic polar solvent having a dipole moment of more than 3.5;
(b) 70–20% by weight of alkanolamine compounds; and
(c) 0.1–10% by weight of 2,2'[[methyl-1H-benzothiazol-1-yl)methyl]imino]bis-ethanol.

4 Claims, No Drawings

PHOTORESIST STRIPPING COMPOSITION

BACKGROUND OF THE INVENTION

1. Field of the Invention

The present invention relates to a photoresist stripping composition containing the combination of (1) selected solvents; (2) alkanolamines; and (3) a selected corrosion inhibitor.

2. Description of the Prior Art

The photoresist stripper art is replete with numerous references to stripper compositions containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinse, as residual stripper solution may be retained on the substrate surface and/or substrate carrier after the stripping step. In other words, the amine component of the stripper composition does not corrode the substrate by itself, but can trigger water to cause the corrosion.

To solve this problem, an intermediate rinse step with an organic solvent has been used between the stripping step and the post-stripping rinse with water. For example, isopropyl alcohol solutions have been used for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent wastes. The present invention provides such a solution.

Illustrative of references suggesting photoresist stripper compositions containing the combination of a polar solvent and an amine compound are the following:

1. U.S. Pat. No. 4,617,251, which issued to Sizensky et al. (Olin Hunt) on Oct. 14, 1986, teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-pyrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward (J. T. Baker) on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N, N-diethyl butyramide and N-methyl-N-ethyl propionamide) and (B) selected amine compound (e.g., monoethanolamine, monopropanolamine, methyl-aminoethanol). The patent also teaches this stripper may optionally contain a water miscible nonionic detergent (e.g., alkylene oxide condensates, amides and semi-polar nonionics).

3. U.S. Pat. No. 4,824,763, which issued to Lee (EKC) on Apr. 25, 1989, teaches positive-working photoresist stripping composition containing (A) triamine (e.g., diethylene-triamine) and (B) a polar solvent (e.g., N-methyl-2-pyrrolidone, dimethylformamide, butyrolactone, aliphatic hydrocarbons, aromatic hydrocarbons, chlorinated hydrocarbons).

4. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

5. U.S. Pat. No. 5,102,777, which issued to Lin, et al. on Apr. 7, 1992, teaches a positive photoresist stripper composition comprising (A) a solvent (e.g., a pyrrolidone compound, a diethylene glycol monoalkyl ether, a sulfur oxide compound, a sulfolane compound or a mixture thereof); (B) an amine (e.g., alkanolamine); and (C) a fatty acid (e.g., capric acid, lauric acid, talmitric acid, caprylic acid, myristic acid, oleic acid, stearic acid, linoleic acid, linolic acid, buthylic acid, abietic acid, isooctoic acid, isohexadecanoic acid, isostearic acid, behenic acid, undecylenic acid, hydroxystearic acid, chipanodonic acid, arachidonic acid, oleostearic acid, and 2-ethylhexadecanilic acid).

6. U.S. Pat. No. 5,279,791, which issued to Lee (EKC) on Jan. 18, 1994, teaches a stripping composition for removing resists from substrates containing (A) hydroxylamine (e.g., $NH_2OH$); (B) at least one alkanolamine; and optionally (C) at least one polar solvent.

7. U.S. Pat. No. 5,308,745, which issued to Schwartzkopf on May 3, 1994, teaches an alkaline-containing photoresist stripping composition comprising (A) a stripping solvent (e.g., 2-pyrrolidinone, 1-methyl-2-pyrrolidinone, 1-ethyl-2-pyrrolidinone, 1-propyl-2-pyrrolidinone, 1-hydroxyethyl-2-pyrolidinone, 1-hydroxypropyl-2-pyrrolidinone, diethylene glycol monoalkyl ethers, dialkyl sulfones, dimethyl sulfoxide, tetrahydrothiophene-1,1-dioxides, polyethylene glycol, dimethylacetamide and dimethylformamide; (B) a nucleophilic amine (e.g., 1-amino-2-propanol, 2-(2-aminoethoxy)ethanol, 2-aminoethanol, 2-(2-aminoethylamino)-ethanol and 2-(2-aminoethylamino) ethylamine); and (C) a non-nitrogen containing weak acid (e.g., acetic acid, phthalic acid, 2-mercaptobenzoic acid, 2-mercaptoethanol, 1,3,5-trihydroxybenzene, pyrogallol, resorcinol, 4-tert-butylcatechol, carbonic acid and hydrofluoric acid).

8. U.S. Pat. No. 5,334,332, which issued to Lee (EKC) on Aug. 2, 1994, teaches a photoresist resist stripping and cleaning composition comprising (A) hydroxylamine; (B) at least one alkanolamine; (C) water; (D) optionally, at least one polar solvent; and (E) optionally, a chelating reagent (e.g., thiophenol, ethylenediamine tetraacetic acid and 1,2-dihydroxybenzene) to reduce the surface metal contamination on wafers.

9. U.S. Pat. No. 5,399,464, which issued to Lee on Mar. 21, 1995, teaches a stripping composition for removing positive organic photoresist from a substrate comprising (A) a triamine (e.g., diethylene triamine); (B) a nonpolar or polar organic solvent (e.g., N-methyl pyrrolidone).

10. U.S. Pat. No. 5,417,802, which issued to Oberg on May 23, 1995, teaches a material useful for photoresist removal or post-metal etch clean up that comprises (A) primary or secondary amines; (B) solvents (e.g., dimethyl sulphoxide or dimethylacetylamide); and (C) organic ligands such as crown ethers or cyclodextrines).

11. U.S. Pat. No. 5,472,830, which issued to Honda on Dec. 5, 1995, teaches a non-corrosion photoresist stripping composition comprising (A) an organic polar solvent; (B) an amine compound; (C) selected amino acid; and (D) optionally, water.

12. German Published Patent Application No. DE3828513, which issued to Schulz (Merck) on Mar. 1, 1990, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

13. European Patent Application No. 647,884, which was published on Apr. 12, 1995, teaches an alkaline photoresist stripping composition comprising (A) an organic solvent system; (B) amines; and (C) reducing agents (e.g., ascorbic acid, uric acid, butyne diols, unsaturated ketones, tetramisole, hydrazine and its derivatives, oximes, hydroquinone, pyrogallol, gallic acid and alkyl esters thereof, tocopherol, 6-hydroxy-2,5,7,8-tetramethylchroman-2-carboxylic acid, butylated hydroxytoluene, butylated hydroxyanisole, 2,6-di-tert-butyl-4-hydroxymethylphenol, thiols, aldehydes and derivatives thereof).

14. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

15. Japanese Published Patent Application No. 63-208043, which was published to R. Ohtani (Kanto Chemical) on Aug. 29, 1988, teaches a positive-working photoresist stripper composition containing (A) 1,3-dimethyl-2-imidazolidinone; (B) a water-soluble organic amine [e.g., monoethanolamine, 2-(2-aminoethoxy)-ethanol, triethylene(tetramine)]. The application also teaches a surfactant may be added to the stripper.

16. Japanese Published Patent Application No. 64-081949, which was published to K. Matsumoto (Asahi Chemical) on Mar. 28, 1989, teaches a positive-working photoresist stripper composition containing (A) a solvent (e.g., gamma-butyrolactone, N-methylformamide, N,N-dimethylformamide, N,N-dimethylacetamide or N-methylpyrrolidone); (B) an amino alcohol (e.g., N-butyl-ethanolamine and N-ethyldiethanolamine); and (C) water.

17. Japanese Published Patent Application No. 64-088548, which was published to S. Shiotsu (Nagase Denshi Kagaku) on Apr. 3, 1989, teaches a photoresist stripping composition comprising (A) monoethanol amine; (B) glycol monoalkyl ether; (C) water; and (D) optionally, 2-butyne-1,4-diol as a corrosion inhibitor for a positive photoresist stripper.

18. Japanese Published Patent Application No. 4-124668, which was published to K. Wakiya (Tokyo Ohka) on Apr. 24, 1992, teaches a less corrosive photo resist stripping agent comprising (A) an organic amine; (B) a glycol monoalkyl ether solvent; (C) 2-butyne-1,4-diol; and (D) a phosphoric acid ester surfactant.

19. Japanese Published Patent Application No. 4-350660, which was published to H. Goto (Texas Instruments, Japan and Kanto Chemical, Inc.) on Dec. 4, 1992, teaches a stripper for positive photoresists comprising (A) 1,3-dimethyl-2-imidazolidinone (DMI), (B) dimethylsulfoxide (DMSO) and (C) a water-soluble amine [e.g., monoethanolamine or 2-(2-amino-ethoxy) ethanol] wherein the amount of the water-soluble amine is 7–30% by weight.

20. Japanese Published Patent Application No. 5-045894, which issued to Ward (ACT, Inc.) on Feb. 26, 1993, teaches the use of 6-hydroxy-quinoline as a corrosion inhibitor in a positive photoresist stripper.

21. Japanese Published Patent Application No. 7-028254, which published to Kanto Kagaku KK on Jan. 31, 1995, teaches photoresist stripper composition comprising (1) a sugar-alcohol (e.g., D-sorbitol), isopropyl alcohol, dimethyl sulphoxide, or 1,3-dimethyl-2-imidazolidinone; (2) an alkanolamine; (3) water; and (4) quaternary ammonium hydroxide.

22. Japanese Published Patent Application No. 7-271056, which was published to K. Adachi, et al. (Mitsubishi Gas Chemical), teaches a stripping and cleaning agent for removing dry-etching photoresist residues from a semiconductor substrate comprising (A) an organocarboxylic ammonium salt or an amine carboxylate; and (B) a fluorine compound.

None of these references suggest the addition of the selected corrosion inhibitor disclosed in this invention to a mixture of selected solvents and selected amines for application to the photoresist stripping.

BRIEF SUMMARY OF THE INVENTION

The present invention, therefore, is directed to a resist stripper composition comprising:

(a) from about 20 to about 70% by weight of an organic polar solvent having a dipole moment of more than 3.5;

(b) from about 70 to about 20% by weight of an alkanolamine compound; and (c) from about 0.1 to about 10% by weight of 2,2'-[[(methyl-1H-benzothiazol-1-yl)methyl]imino]bis-ethanol.

DESCRIPTION OF THE PREFERRED EMBODIMENTS

As stated above, the non-corrosive stripper of the present invention has three critical components, namely:

(a) a polar solvent having a dipole moment of more than 3.5;

(b) an alkanolamine; and (c) 2,2'-[[(methyl-1H-benzothiazol-1-yl)methyl]imino] bis-ethanol.

The solvent used in this stripper composition should have a good solubility for cross-linked resist films. In other words, the solvent is necessary to efficiently remove cross-linked resist films which are strongly adhering to the substrate.

The solvent should preferably meet the following criteria:
(1) Its dipole moment should be more than 3.5, more preferably, more than 4.0.
(2) Its boiling point should be more than 130°–180° C.
(3) Its flash point should be more than 60°–90° C.

Any of the solvents mentioned in the patents and patent applications discussed above may be used herein if that particular solvent has a dipole moment of more than 3.5. Amides are particularly preferred. In particular, cyclic amides such as N-alkyl-2-pyrrolidones (e.g., N-methyl-2-pyrolidone), N-hydroxyethyl-2-pyrrolidone and mixtures thereof are especially preferable from a view point of stripping power and low toxicity.

As mentioned above, another critical component of the stripper is an alkanolamine compound. Any of the alkanolamines mentioned in the patents and patent applications discussed above may be used herein.

Particularly, the most preferable are monoethanolamine, 2-(2-aminoethoxy)ethanol, 2-(2-aminoethylamino)ethanol, diethanolamine and triethanolamine.

The third essential component of the stripper composition of this invention is 2,2'-[[methyl-1H-benzothiazol-1-yl)methyl]imino]bis-ethanol working as a corrosion inhibitor. This compound has the following chemical formula:

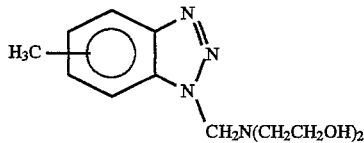

It is commercially available from Ciba-Geigy Ltd. as IRGAMET 42. It is known to work as a corrosion inhibition in the areas of metal-working fluids and hydralic fluids but never tested in the area of the photoresist stripper.

It has firstly been found that this compound can effectively inhibit corrosion without any damage of the stripping power of the claimed amines. This component is superior to other known corrosion inhibitors in that it has a good balance of the various functional and economic requirements, namely, the following:
(a) excellent prevention of various different types of the metal corrosion of substrate surfaces;
(b) favorable material cost for the desired corrosion inhibition effect.

The preferred amounts of these ingredients are about 40–65% polar solvent; about 25–60% amine compound; and about 0.2–5% corrosion inhibitor; all based on the weight of the stripper composition.

Optionally, it may be desirable to add a novolak resin having a weight-average molecular weight ($M_w$) from about 200 to about 5,000 to the compositions of the present invention. Such novolak resins have unexpectedly been found to reduce the particle and metal levels at the substrate surface.

Any type of novolak resin structure within the above molecular weight range is believed to be suitable. Preferably, the novolak may be any addition-condensation product of one or more monomeric phenols (e.g., phenol, o-cresol, m-cresol, p-cresol, 2,3-xylenol, 2,5-xylenol, 3,5-xylenol, 2,3,5-trimethylphenol, and admixtures thereof) with a suitable aldehyde source, e.g., formaldehyde, paraformaldehyde, benzaldehyde, acetaldehyde, or mixtures thereof.

Preferably, the amount of novolak resin added may be from about 0.01 to about 1% by weight of the total stripper formulation.

Various other ingredients known to those skill in the art may optionally be included in the stripping composition e.g. dyes or colorants, wetting agents, surfactants, antifoamers and so forth. Generally, the amount of each of these optional ingredients would be about 0.1–0.5% by weight, based on the total stripper composition The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripper composition of the invention is effective in removing a wide variety of organic polymeric materials from substrates. Exemplificative organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethylmethacrylate-containing resists. In particularly preferred embodiments of the invention, the stripping composition has been found to be highly effective in removing positive resists containing a novolak resin and a diazo ketone sensitizer, e.g., ortho naphthoquinone diazide sulfonic acid ester; resists of this type include HPR 204 Series POSITIVE RESIST, HPR 504 Series POSITIVE RESIST, OiR32 Series POSITIVE RESIST, and HPR 6500 Series POSITIVE RESIST, all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, polyimides, and so forth.

The present invention is further described in detail by means of the following Example and Comparison. All parts and percentages are by weight and all temperatures are degrees Celsius unless explicitly stated otherwise.

EXAMPLE

Silicon wafers, 125 mm in diameter, were used for the following stripping tests which were carried out at 90° C. for 10 minutes in a quartz tank without recirculation or filtration. After the processing, the wafers were immediately rinsed with deionized water in an overflow tank for 10 minutes at room temperature and spun dry.

The stripping efficiency was determined by measuring the amount of residues left on the wafers after the removal of a photoresist film casted with a stripper solution which consists of N-methyl-2-pyrrolidone (NMP), 50 g, 2-(2-aminoethoxy)ethanol (AEE), 50 g, and IRGAMET 42 obtained from Ciba-Geigy, 5.26 g at 5.0 wt. % to the total stripper weight. For this measurement, OCG positive i-line photoresist, OiR32, was spun coated on the wafers, exposed, developed, and hard baked at 150° C. for 15 minutes. The remaining residues on the wafers after the stripping were detected as Light Point Defect (LPD) with a Censor ANS100 light scattering equipment. LPD's which are bigger than 0.15 micron in diameter were measured as residual LPD to evaluate the stripping efficiency.

The corrosion of Al/Cu/Si alloy was evaluated on blanket layers. The change in the sheet resistance of the blanket layers was measured by 4 point probe. The corrosion parameter, ▲ t, was calculated by using the following equation:

$$\blacktriangle t = P \left( \frac{1}{Rs(B)} - \frac{1}{Rs(A)} \right)$$

where P is the resistivity of the metal film in ohm-cm, Rs(B) is the sheet resistance in ohm/square before the stripping, and Rs(A) is the sheet resistance in ohm/square after the stripping.

The results are summarized in Table 1 in comparison with Reference 1 in which NMP/AEE (50:50) admixture was used without any additive. This result indicates that the addition of IRGAMET 42 to the stripper composition results in a significant reduction of the corrosion without any degradation of the stripping efficiency.

TABLE 1

|  | Residual LPD (#/wafer) | Corrosion Parameter Δ t (nm) |
|---|---|---|
| Example 1 | 1,500 | 20 |
| Reference 1 | 1,000 | 70 |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A photoresist stripper composition comprising:

(a) from about 20 to about 70% by weight of an organic polar solvent having a dipole moment of more than 3.5;

(b) from about 70 to about 20% by weight of an alkanolamine compound; and (c) from about 0.1 to about 10% by weight of 2,2'-[[(methyl-1H-benzothiazol-1-yl)methyl]imino]bis-ethanol; all percents based on the weight of the stripper composition.

2. The stripper composition of claim 1 wherein said solvent (a) is a cyclic amide.

3. The stripper composition of claim 2 wherein said cyclic amide is selected from the group consisting of N-alkyl-2-pyrrolidone, N-hydroxyalkyl-2-pyrrolidone, and mixtures thereof.

4. The stripper composition of claim 1 wherein said alkanolamine is selected from the group consisting of monoethanolamine, 2-(2-aminoethoxy)ethanol and 2-(2-aminoethylamino)ethanol, diethanolamine, and triethanolamine.

* * * * *